United States Patent [19]

Beck et al.

[11] Patent Number: 4,642,492
[45] Date of Patent: Feb. 10, 1987

[54] MULTIPLE PHASE CLOCK BUFFER MODULE WITH NON-SATURATED PULL-UP TRANSISTOR TO AVOID HOT ELECTRON EFFECTS

[75] Inventors: John C. Beck, Northborough; Daniel W. Dobberpuhl, Shrewsbury, both of Mass.

[73] Assignee: Digital Equipment Corporation, Maynard, Mass.

[21] Appl. No.: 664,858

[22] Filed: Oct. 25, 1984

[51] Int. Cl.$^4$ .................... H03K 17/06; H03K 17/693
[52] U.S. Cl. ................................ 307/578; 307/200 B; 307/269; 307/443; 307/453; 307/481; 307/482
[58] Field of Search ............... 307/443, 453, 481, 482, 307/450, 578, 543, 269, 200 B, 270

[56] References Cited

U.S. PATENT DOCUMENTS

| | | | |
|---|---|---|---|
| 4,199,695 | 4/1980 | Cook et al. | 307/578 X |
| 4,379,974 | 4/1983 | Plachno | 307/578 X |
| 4,431,927 | 2/1984 | Eaton, Jr. et al. | 307/578 X |
| 4,443,714 | 4/1984 | Nakano et al. | 307/578 X |
| 4,521,701 | 6/1985 | Reddy | 307/481 X |

OTHER PUBLICATIONS

Anderson et al, "FET Inverter and Driver Circuit", *IBM T.D.B.*, vol. 16, No. 1, Jun. 1973, pp. 50-51.

Primary Examiner—Stanley D. Miller
Assistant Examiner—D. R. Hudspeth
Attorney, Agent, or Firm—Cesari and McKenna

[57] ABSTRACT

A clock buffer circuit for multiple phase complementary clocking signals that receives a plurality of corresponding enabling signals and generates a like plurality of clock signals in response thereto. Each clocking signal is generated by a buffer module including a resistor, a pull-up transistor and a pull-down transistor, which are connected in series between a positive power supply and ground, with the clocking signal being taken from the node between the pull-up and pull-down transistors. In each module, before the clocking signal shifts from a low state to a high, the pull-down transistor is on so that the clocking signal is at a low state. The pull-up transistor in each module is controlled by the corresponding enabling signal and is enabled to begin conducting at the time that the clocking signal is to shift to a high state. The resistor keeps the pull-up transistor in its linear, non-saturated operating regions, which results in an increase in the intrinsic capacitance in the pull-up transistor from the saturated condition. After the pull-up transistor is turned on, allowing the intrinsic capacitance of the pull-up transistor to charge, the pull-down transistor is then turned off and the gate of the pull-up transistor is isolated. The voltage levels at the gate and source terminals of the pull-up transistor rise in a bootstrapping operation. When the clock signal is to shift to a low state, the complementary phase clocking signal turns on the pull-down transistor.

8 Claims, 5 Drawing Figures

MODULE 17A

MODULE 17B

MULTIPLE PHASE CLOCK BUFFER MODULE WITH NON-SATURATED PULL-UP TRANSISTOR TO AVOID HOT ELECTRON EFFECTS

BACKGROUND OF THE INVENTION

1. Field of the Invention

The invention relates generally to the field of clock buffer circuits and more specifically to those circuits which buffer multiple phase clock signals.

2. Description of the Prior Art

In digital devices, particularly in microprocessors and other devices in which various operations must be synchronized, global clock or timing signals are used to synchronize the various circuits within the device. The conductors, or lines, carrying the clock signals are often quite lengthy, as they must extend throughout the devices to all of the various circuits which must be synchronized. Because the lengths of the lines which carry the timing signals and the number of circuit elements driven by the timing signals result in large capacitive loads for the circuits which generate the clocking signals, those circuits must be able to provide large amounts of current to ensure that the clock signals have fast rising and falling edge rates. The problem is particularly acute in integrated circuit chips, since it is desired to keep the active devices as small as possible, which limits the amount of current available from the devices.

Typically, timing signals are initially generated by a flip-flop or a set of flip-flops connected to generate inter-related multiple-phase output signals. Since flip-flops of the switching speed required for the clock signals of current microprocessors typically cannot also provide the currents required for the fast rise and fall times, the output signals from the flip-flops are transmitted as enabling signals to a buffer circuit, which includes transistors large enough to produce clocking signals having the required currents. The output signals from the buffer circuit comprise the clock signals which are transmitted to the various synchronized circuits throughout the device.

Since the clock buffer circuit must provide large amounts of current, the clock buffer can take up a significant portion of the area of chips designed using very large scale integration techniques. The problem of providing a clock buffer circuit on such chips is greatly magnified when, as is the case with many microprocessors, the clock circuit must provide clock signals of several different phases all of which are themselves synchronized. Not only must the flip-flops providing the enabling signals be synchronized, the buffer circuits must also be synchronized to ensure that the generated clocking signals have the required rise and fall characteristics with respect to each other.

In prior clock circuits, the clock buffer circuits used bootstrapping techniques to boost the voltage level of the output signal of the buffer circuit to a desired nominal output voltage. In such bootstrapping techniques, pull-up and pull-down field effect transistors are connected in series between a positive power supply and ground. A bootstrap capacitor is connected to the gate terminal of the pull-up transistor and the output clock signal is taken from the node between the two transistors. The enabling signal is applied to the gate of the pull-up transistor. When the clocking signal is at ground level, the pull-down transistor is turned on and the pull-up transistor is turned off. The enabling signal from the flip-flop clock signal generator begins to rise, which turns the pull-up transistor on, when the clocking signal is to rise. Since both the pull-up and pull-down transistors at this point are conducting, a condition known as "overlap", the voltage level of the clocking signal increases slightly above ground. The capacitor connected to the gate of the pull-up transistor is charged during this period. The gate of the pull-up transistor is then isolated and the pull-down transistor is turned off, which causes the voltage level of the gate of the pull-up transistor to rise above the power supply voltage level and the voltage level of the node between the transistors, from which the clocking signal is taken, to increase to the power supply voltage level.

The prior bootstrap techniques had a number of problems, however. The overlap current, that is, the current flowing through the pull-up and pull-down transistors when they were both conducting, was quite large. Furthermore, the required bootstrap capacitors occupied large amounts of chip area, which reduced the amount of chip area available for other circuits.

Furthermore, since the pull-up transistor was driven into saturation, electrons in the transistor's channel were subject to a high electric field associated with the high drain to source voltage accompanying saturation, which could accelerate them into the substrate and or cause tunnelling into the gate oxide insulating the gate terminal from the substrate, so-called "hot electron" problems. The electrons driven into the substrate caused noise problems in signals throughout the rest of the chip, while electrons tunnelling into the gate oxide caused a degradation in the operation of the transistor by increasing the threshold voltage required to turn the transistor on. Since this degradation occurred over, and varied with, time, and also varied from transistor to transistor, the reliability of the chip would undergo a steady and unpredictable deterioration.

SUMMARY OF THE INVENTION

These and other problems are corrected by providing a new and improved clock buffer circuit for use on an integrated circuit chip which receives a plurality of enabling signals having predetermined phasing relationships from, for example, a flip-flop circuit and generates a like number of output clocking signals having the same phasing relationships to be transmitted to other circuits on the chip.

The new clock buffer circuit includes a bootstrap circuit having a resistor, a pull-up transistor and a pull-down transistor connected in series between the positive power supply and ground. The enabling signal from the flip-flop circuit is connected to the gate of the pull-up transistor and a steering circuit responsive to the other clock phase signals is connected to the gate of the pull-down transistor. The output of the clock signal is taken from the node between the two transistors.

Initially, the pull-down transistor (that is, the transistor connected to ground) is turned on, that is, conducting, and the pull-up transistor is turned off, or non-conducting. In that condition, the clock signal output is at a ground, or low, voltage level. When the clock signal is to switch from the ground level to a high level, that is, the power supply voltage level, the enabling signal turns the pull-up transistor on, causing it to begin conducting. The resistor and two transistors form a voltage divider when both transistors are conducting to raise the voltage level at the output node towards the voltage level of the positive power supply. In this condition, and depending on the parameters of the circuit, during this overlap period the voltage level of the output clocking signal may be on the order of several hundred millivolts. The second transistor is then turned off isolating the node between the transistors from ground, and the gate of the first transistor is isolated from the rest of the circuit, causing it to float. The charge stored in the intrinsic gate to source and gate to drain capacitances of the pull-up transistor causes the voltage level at its gate terminal to be bootstrapped to a voltage level above that of the positive power supply, causing the voltage at the source terminal of the pull-up transistor, that is, the node between the transistors, from which the clock signal output is taken, to increase to approximately the level of the positive power supply.

The presence of the resistor in the bootstrap circuit provides several benefits. Since the pull-up transistor is not saturated, the sum of its intrinsic gate to drain and gate to source capacitances is greater than if the pull-up transistor were saturated. The resistor also reduces the source to drain voltage difference across the pull-up transistor, reducing the "hot electron" effect and accompanying noise and deterioration problems.

Furthermore, the resistor limits the overlap current, that is, the current that passes through the pull-up and pull-down transistors when they are both on. Prior circuits do not have a current-limiting resistor, resulting in a wasting of power, generation of excess heat, and requiring interconnects having larger cross-sections to handle the currents. In addition, since, in the prior art, the drain terminal of the pull-up transistor was connected directly to the positive power supply, the drain was held at the voltage level of the positive power supply. The addition of the resistor allows the voltage level of the drain of the pull-up transistor to vary, which enables the gate to source and gate to drain capacitances to both effectively couple charge into the gate of the pull-up transistor, resulting in sufficient bootstrap action without the need for a discrete bootstrap capacitor.

In one specific embodiment, the clock buffer circuit provides four clock signals in two pairs of complementary signals, with the signal pairs being displaced by one-fourth period. In that embodiment, each clock signal is generated by a separate module of the buffer circuit, with the modules generating each pair of signals being cross-connected to control and synchronize the rising and falling of the respective signals. Each module sends two signals to the other module in the pair, one signal controlling the rising and the other to controlling the falling of the other signal in the pair. The pairs of modules are also cross-connected to control which of the signals received from the other module in each pair controls the receiving module.

BRIEF DESCRIPTION OF THE DRAWINGS

The invention is pointed out with particularity in the appended claims. The above and other advantages of the invention may be better understood from the following detailed description when taken in conjunction with the accompanying drawings in which:

DETAILED DESCRIPTION OF AN ILLUSTRATIVE EMBODIMENT

Figure 1:
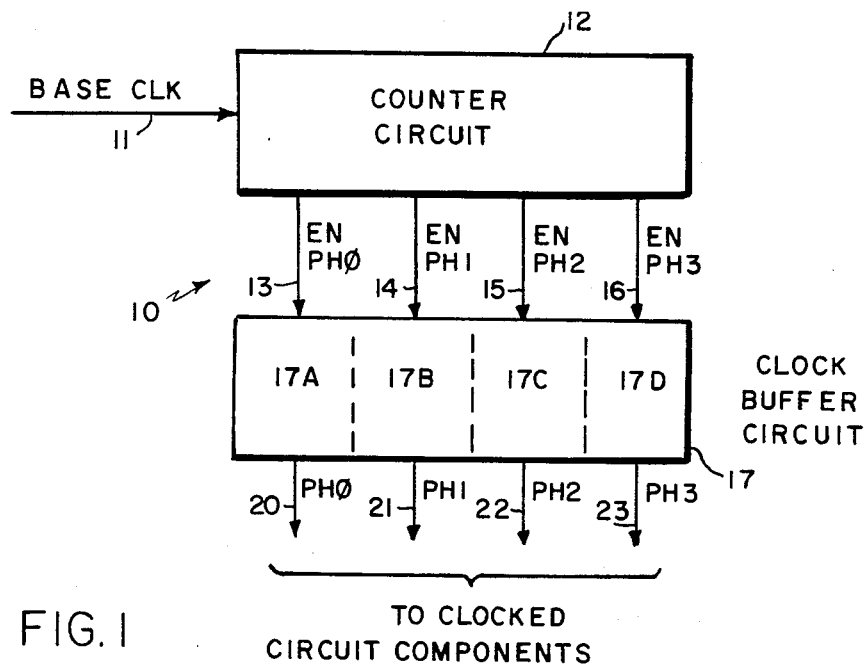
FIG. 1 is a general block diagram of a clock signal generating circuit including the instant invention.

With reference to FIG. 1, a clock circuit 10 receives a BASE CLK base clocking signal from, for example, a crystal oscillator, over a line 11. The BASE CLK signal is directly received in a counter circuit 12, which generates four enabling signals identified as EN PH0 through EN PH3 (which are generally referred to as EN PHn, where "n" is an integer between 0 and 3) and transmits them over lines 13 through 16 to a clock buffer circuit 17. The clock buffer circuit comprises four modules 17A through 17D, each of which receives an EN PHn signal from the counter circuit and, in response thereto and to control signals from the other modules, generates a clock signal PH0 through PH3. The buffer circuit modules then transmit the generated clock signals on lines 20 through 23 to the clocked circuit components on the remainder of the device (not shown).

Figure 2:
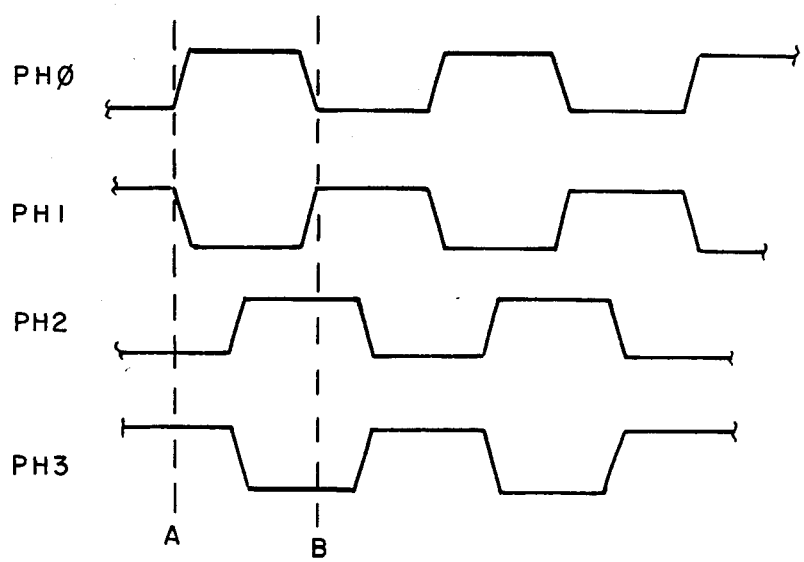
FIG. 2 contains a timing diagram illustrating the relationship among the clock signals generated by the circuit depicted in FIG. 1.

FIG. 2 illustrates the general timing relationships among the various clocking signals PHn ("n" being an integer from 0 to 3) of one embodiment of the invention. The EN PHn enabling signals have the same timing relationships as the corresponding PHn clocking signals, although it will be recognized by those skilled in the art that the PHn clocking signals will be delayed from the respective EN PHn signals due to gate and other delays in the buffer circuit modules. As shown in FIG. 2, the PH0 and PH1 signals are complementary signals, that is, they are 180° out of phase. The PH2 and PH3 signals are also complementary signals. The transistions in the PH2 and PH3 signals occur midway between the transitions in the PH0 and PH1 signals, and the pairs of signals are thus a quarter period out of phase.

As has been noted, the EN PH0 through EN PH3 enabling signals generated by counter circuit 12 have the same general relationship as the PH0 through PH3 clocking signals depicted in FIG. 2. The clock buffer circuit 17 is provided to ensure that sufficient current is provided to the clocked circuit components on the rest of the device so that the PH0 through PH3 clock signals have fast rise and fall times. It will be appreciated that, since the lines carrying clocking signals on, for example, an integrated circuit chip are often relatively quite long, since they travel to and control large numbers of circuits, a large amount of current must be provided rapidly to ensure acceptably fast rise and fall times. Typically, the flip-flops which generally comprise a counter circuit such as counter circuit 12 are not able to provide the required current, and so the clock buffer circuit is connected to the counter circuit to buffer the enabling signals from the counter circuit to provide clock signals having the required currents.

Figure 3A:
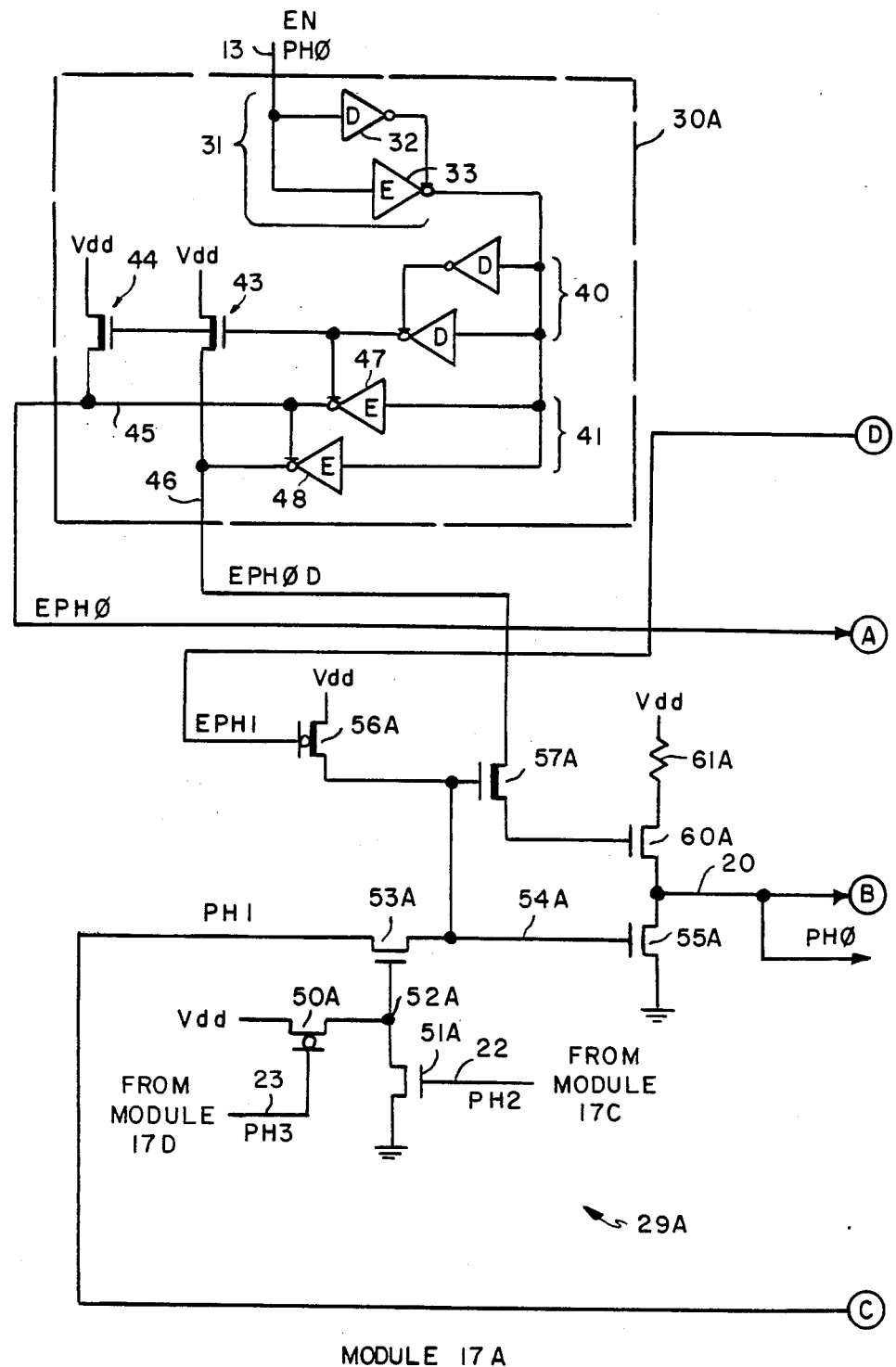
FIGS. 3A and 3B together form is schematic circuit diagram depicting two modules of the clock buffer circuit depicted in FIG. 1 which generate complementary clock signals.
Figure 3B:
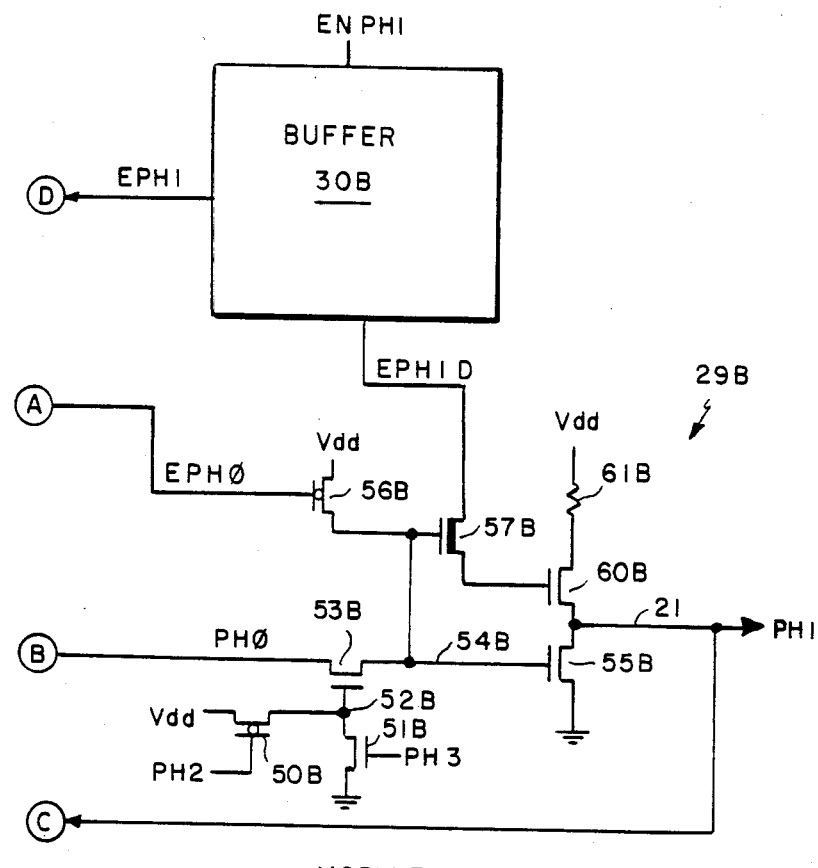

FIGS. 3A and 3B depict a detailed circuit diagram of two modules of the buffer circuit 17, specifically modules 17A and 17B, which, respectively, receive the EN PH0 and EN PH1 enabling signals and generate the PH0 and PH1 clock signals (FIG. 2). The circuits comprising the other modules 17C and 17D are similar to the circuits depicted in FIGS. 3A and 3B. In a physical implementation of the circuit, the actual sizes of the transistors which are used in the circuit will depend on the amount of current required to be supplied by the particular module.

With reference to FIG. 3A, module 17A includes a buffer section 30A which receives the EN PH0 enabling signal on line 13 from counter circuit 12 (FIG. 1) and which generates two enabling signals EPH0 and EPH0D, the EPH0D signal being delayed from the EPH0 signal. The amount of the delay which is desired between the EPH0 and EPH0D enabling signals depends on factors which will be explained below. The EPH0D enabling signal is transmitted to a generating section 29A, which also receives the EPH1 enabling signal and the PH1 clock signal from module 17B (FIG. 3B) and the PH2 and PH3 clock signals from modules 17C and 17D. In response to these signals, module 17A generates the PH0 clock signal.

The buffer section 30A is conventional, essentially including a plurality of inverter circuits 31, 40 and 41 connected to form two non-inverting buffers. The EPH0 enabling signal is taken from node 45 and the delayed enabling signal EPH0D is taken from node 46, which forms the output of the second buffer in the series. Since the buffer section is conventional, it will not be described further herein.

With reference to FIG. 3B, module 17B also includes a buffer section 30B, which is similar to buffer section 30A and so will not be described in detail. The buffer section 30B receives the EN PH1 enabling signal on line 14 from counter circuit 12 (FIG. 1) and also generates two enabling signals EPH1 and EPH1D, the EPH1D signal being delayed from the EPH1 signal in like manner to the delay between the EPH0 and EPH0D signals. The EPH1D enabling signal is transmitted to a generating section 29B, which also receives the EPH0 enabling signal and the PH0 clock signal from module 17A (FIG. 3A) and the PH2 and PH3 clock signals from modules 17C and 17D. In response to these signals, module 17B generates the PH1 clock signal.

In brief, the EPH0D delayed enabling signal is transmitted to generator section 29A of module 17A and is used with the EPH1 enabling signal and the PH1 clock signal from module 17B to control the generation of the PH0 clock signal. Similarly, the EPH1D enabling signal is transmitted to generator section 29B (FIG. 3B) and is used with the EPH0 enabling signal and the PH0 clock signal from module 17A to control the generation of the PH1 clock signal by generator section 29B. Both modules receive the PH2 and PH3 clock signals from modules 17C and 17D. In generator section 29A, the PH2 and PH3 clock signals selectively control the use by generator section 29A of the EPH1 or PH1 signals from module 17B in the generation of the PH0 clock signal, so that the timing of the falling edge of the PH1 signal is used by generator section 29A to control the timing of the rising edge of the PH0 signal and the timing of the rising edge of the EPH1 signal is used to control the timing of the falling edge of the PH0 clock signal. Similarly, the PH2 and PH3 clock signals selectively control the use by generator section 29B of the EPH0 or PH0 signals from module 17A in the generation of the PH1 clock signal, so that the timing of the falling edge of the PH0 signal is used by generator section 29B to control the timing of the rising edge of the PH1 clock signal and the timing of the rising edge of the EPH0 signal is used to control the timing of the falling edge of the PH1 clock signal.

The operation of generator sections 29A and 29B will be described with particular attention to time A in FIG. 2, that is, when the PH1 clock signal is falling and the PH0 clock signal is rising (time A). Since the operation of the generator sections is identical, the operation at time B, when the PH0 clock signal is falling and the PH1 clock signal is falling, will be only briefly noted. The operations at other signal transitions will be apparent to those skilled in the art.

With reference to FIG. 3A, immediately prior to time A, a pull-up transistor 60A connected through a resistor 61A to the positive power supply is off (non-conducting) and its associated pull-down transistor 55A, which is connected to ground, is on (conducting). As a result, the node between the transistors 55A and 60A, from which the PH0 clock signal is taken, is at the ground voltage level. Since, at this time, the EPH1 signal has just gone low, transistor 56A is also off. Transistor 50A, controlled by the high PH3 clock signal (FIG. 2), is on and transistor 51A, controlled by the low PH2 clock signal, is off, causing node 52A to be high and transistor 53A to be on. With transistor 56A off and transistor 53A on, the node 54A is controlled by the high PH1 clock signal, causing transistor 55A to be on. Transistor 57A, a depletion mode transistor, is also on. Since transistor 55A is on, as noted above, the PH0 clock signal is at the ground voltage level. Transistor 60A is maintained in an off condition by a low EPH0D signal from buffer 30A through the on transistor 57A.

With reference to FIG. 3B, and also immediately prior to time A, a pull-up transistor 60B connected through a resistor 61B to the positive power supply is turned on, and its associated pull-down transistor 55B which is connected to ground, is turned off. As a result of this, and a bootstrapping action described below in connection with transistor 60A, which is identical to the bootstrapping action of transistor 60B, the node between the transistors 55B and 60B, from which the PH1 clock signal is taken, is at the voltage level of the positive power supply. Since the EPH0 signal is low, transistor 56B is also off. Transistor 57B, also a depletion mode transistor, is off since the voltage level of the gate terminal, which was last controlled by the low PH0 signal, is below the voltage level of the source terminal, which is at the high voltage level of the gate terminal of the bootstrapped pull-up transistor 60B, by an amount greater than the threshold. Transistor 50B, controlled by the low PH2 clock signal, is off and transistor 51B, controlled by the high PH3 clock signal, is on. At this time, the node 52B is low, turning off transistor 53B and preventing the low PH0 clock signal from controlling node 54B.

The fall of the EN PH1 enabling signal causes the EPH1 and EPH1D signals to fall. When the EPH1 signal is low, transistor 56A is off, and node 54A is controlled by the PH1 clock signal through transistor 53A.

The subsequent rise of the EN PH0 enabling signal enables the buffer 30A to cause the EPH0 enabling signal to go high, to a voltage level of the positive power supply. When the EPH0 enabling signal goes high, it turns on transistor 56B, which, in turn, turns on transistors 55B and 57B. Turning on transistors 55B and 57B, in turn, causes the PH1 clock signal to begin falling, and the falling EPH1D signal, which is applied to transistor 60B through transistor 57B, also causes transistor 60B to rapidly turn off, which contributes to a fast fall time for the PH1 clock signal.

Figure 3C:
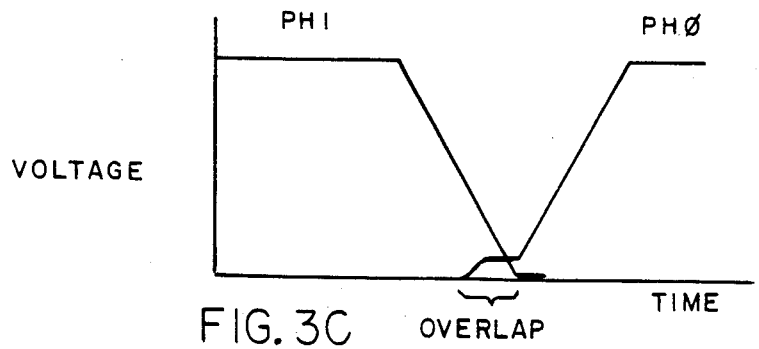
FIG. 3C is a diagram useful in understanding the circuit depicted in FIG. 3A.

With reference to FIG. 3A, when the EPH0D enabling signal then goes high, transistor 60A is turned on through transistor 57A. At this point, the PH1 clock signal has not completely fallen, and so both the pull-up transistor 60A and the pull-down transistor 55A are on and conducting at the same time. Resistor 61A limits the overlap current which flows through transistors 60A and 55A at this time when both are conducting, thereby reducing the power drawn from the positive power supply. With reference to FIG. 3C, which depicts the voltage as a function of time of the PH0 and PH1 clock signals around time A, the signal voltage resulting from the overlap current is reflected in a small increase in the voltage level of the PH0 clock signal. Since transistor 60A is turned on, it is also storing charge in its intrinsic gate to drain and gate to source capacitances. The resistance of resistor 61A is selected to maintain transistor 60A in a linear, unsaturated mode of operation to maximize the intrinsic gate to source and gate to drain capacitances of the transistor and eliminate the need for extrinsic bootstrap capacitors.

With reference again to FIG. 3A, since transistor 53A is on and the PH1 signal is falling, node 54A goes low and turns off both transistor 55A and transistor 57A, the latter causing the gate of transistor 60A to float.

While transistor 55A was on, the source terminal of transistor 60A, from which the PH0 clock signal is taken, was held to approximately ground level, but with transistor 55A off, the voltage level of the source terminal, and thus of the PH0 clock signal, is no longer held at ground level, but instead starts to rise. Furthermore, since, when the pull-down transistor is off, the overlap current portion of current through the resistor is eliminated, the voltage drop across the resistor is decreased, thus causing the voltage level of the drain terminal to rise. Since the voltage levels of both the source and drain terminals of the pull-up transistor 60A are rising, and its gate terminal is isolated by transitor 57A being off, the charge stored in the gate to source and gate to drain capacitances of pull-up transistor 60A causes the voltage level of the gate terminal of the pull-up transistor to rise above the voltage level of the positive power supply in a bootstrapping operation. It will be appreciated by those skilled in the art that, by an appropriate selection of the characteristics of transistor 60A, the voltage level of the gate terminal of the pull-up transistor may be made so as to cause the voltage level at the source terminal, which corresponds to the node between the transistor 60A and transistor 55A from which the PH0 clock signal is taken, to increase to about the voltage level of the positive power supply. At this point, the PH0 signal is high and the PH1 signal is low.

At time B (FIG. 2), the same operations occur, except that the PH1 clock signal rises and the PH0 clock signal falls. At this time, the PH2 clock signal is high and the PH3 clock signal is low, turning off transistor 53A and turning on transistor 53B. Transistor 56A (FIG. 3A) is turned on by the high EPH1 enabling signal from buffer 30B (FIG. 3B). Since transistor 53A is off, node 54A is controlled by transistor 56A. Transistor 56A, in turn, turns on transistors 55A and 57A, thereby causing the PH0 signal to fall, and transistor 60A is turned off by the low EPH0D signal. The operation of the generator section 29B in FIG. 3B at time B is the same as described above for generator section 29A at time A.

As has been noted, the EPHnD signals are delayed from the respective EPHn signals. The delay time is selected to permit the complementary clock signals to have the desired synchronization of rising and falling which, in turn, is also a factor in controlling the overlap time when both transistors 55A or 55B and 60A or 60B, respectively, in the respective generator sections are on. For example, at time A, as described above, the EPH0 signal controls when the PH1 clock signal begins to fall. The EPH0 signal turns on transistor 56B (FIG. 3B), which, in turn, turns on transistor 55B, causing the PH1 signal to begin to fall. The EPH0D signal then controls when the PH0 clock signal begins to rise, as it turns on transistor 60A.

It will be appreciated that the operation of clock signal generators 29A and 29B has been described when they are in a steady state mode of operation, several clock cycles after the buffer circuit is initially turned on. When the circuit is initially turned on, several cycles are required to enable the modules 17A through 17D to allow the clock signals to have uniform amplitudes.

The resistances of resistors 61A and 61B are selected to keep the pull-up transistors 60A and 60B in their linear, non-saturated, operating ranges. When the transistors are kept non-saturated, the sum of the intrinsic gate to drain and gate to source capacitances is larger than if the transistors were allowed to be saturated, thereby eliminating the need for explicit bootstrap capacitors connected to the gate terminal of the pull-up transistor. The resistors also limit the current through the pull-up and pull-down transistors during the overlap period, thereby allowing a reduction in the amount of power drawn by these transistors during this period.

The resistors 61A and 61B also reduce "hot electron effect" problems by reducing the source to drain potentials across the pull-up transistors, which reduces the likelihood of electrons accelerating into the substrate or tunnelling into the gate oxide. The reduction of the source to drain potential across the pull-up transistors helps to reduce potential noise problems from excess substrate currents, and also reduces possible deterioration in operation of the transistors from electrons becoming lodged in the gate oxide.

As has also been noted, the resistors 61A and 61B also serve to limit the overlap current when both the respective pull-up and pull-down transistors are on, which reduces the power consumed by the circuit and also reduces the size the the components required to accommodate the current. In addition, reducing the overlap current helps to reduce the amount of waste heat generated by the circuit, which helps to enhance circuit life and reliability. The resistors also enable the intrinsic and gate to drain capacitance of the respective pull-up transistors to increase the bootstrapping effect while eliminating the need for extrinsic bootstrap capacitors.

It will be appreciated that the invention provides a new and improved clock buffer circuit for generating clock signals, in response to enabling signals, having desired phasing relationships. The foregoing description has been limited to a specific embodiment of this invention. It will be apparent, however, that the invention can be practiced in integrated circuit chips having diverse basic construction, or in chips that use different internal circuitry.

What is claimed as new and desired to be secured by Letters Patent of the United States is:

1. A clock buffer circuit for generating a clock signal in response to a timing signal and a first enabling signal, said clock buffer circuit comprising:
 a. input means for receiving said first enabling signal;
 b. means responsive to said timing signal for generating a second enabling signal, both enabling signals being initially in a high condition prior to the time the clock signal is to be asserted and said first enabling signal being in a low condition at the time said clock signal is to be asserted; and c. signal generating means comprising resistor means, pull-up transistor means and pull-down transistor means serially connected between high and low power supplies, said pull-up transistor means being connected to receive said second enabling signal through a switch means conditioned in response to the assertion of said first enabling signal to couple said second enabling signal to said pull-up transistor means and said pull-down transistor means being connected to receive said first enabling signal, said resistor means being selected to maintain both said transistor means in a non-saturated condition when conducting, the node between said pull-up transistor and said pull-down transistor comprising an output terminal for transmitting said clock signal, such that both said pull-up and pull-down transistor means are energized by said enabling signals to conduct prior to the time the clock signal is to be high, said pull-down transistor being de-energized and said switch means being conditioned in response to the negation of said first enabling signal to isolate said pull-up transistor from said low power supply and said second enabling signal whereby the voltage level at said output terminal is increased due to the charge stored in the intrinsic capacitance in the pull-up transistor.

2. A clock buffer circuit as defined in claim 1 further including means for receiving a third enabling signal which is high in advance of the assertion of the first enabling signal, said third enabling signal receiving means conditioning said switch means to couple said second enabling signal to said pull-up transistor to de-energize said pull-up transistor when said second enabling signal thereafter goes low.

3. A clock buffer circuit as defined in claim 2 further including means for receiving fourth and fifth enabling signals, the fourth enabling signal being high during the time the clock signal is to shift from a low state to an high state and the fifth enabling signal being asserted during the time said clock signal is to shift from an high state to a low state, said input means including first enabling signal switch means connected to said fourth and fifth enabling signal receiving means conditioned to couple said first enabling signal to said pull-down transistor means when said fourth enabling signal is asserted and to not couple said first enabling signal to said pull-down transistor means when said fifth enabling signal is high.

4. A clock buffer circuit as defined in claim 3 in which said input means comprises transistor means having input signal means connected to said input means, output signal means connected to control said pull-down transistor means and said switch means, and control means comprising pull-up transistor means and pull-down transistor means connected in series between drain and source power supplies, the node between said pull-up and pull-down transistors being connected to control said transistor means, said pull-up transistor means being connected to receive said fourth enabling signal and said pull-down transistor means being connected to receive said fifth enabling signal.

5. A clock buffer circuit for generating a plurality of clock signals in response to a like plurality of corresponding timing signals, said clock signals and said timing signals being pairwise complementary signals timed so that transitions between pairs do not overlap, said clock buffer circuit comprising a plurality of modules each generating one of said clock signals and comprising:

a. means for receiving a timing signal and generating in response thereto an enabling signal and an advanced enabling signal having high and low transitions in advance of corresponding transitions of said enabling signal;

b. means connected to the module generating the complementary clock signal for receiving the complementary clock signal;

c. signal generating means comprising resistor means, pull-up transistor means and pull-down transistor means serially connected between high and low power supplies, said pull-up transistor means being connected to receive said enabling signal through a switch means conditioned in response to the assertion of said complementary clock signal to couple said enabling signal to said pull-up transistor means and said pull-down transistor means being connected to receive said complementary clock signal, said resistor means being selected to maintain both said transistor means in a non-saturated condition when conducting, the node between said pull-up transistor and said pull-down transistor comprising an output terminal for transmitting said clock signal, such that both said pull-up and pull-down transistor means are energized by said enabling signal and said complementary signal to conduct prior to the time the clock signal is to be high, said pull-down transistor being de-energized and said switch means being conditioned in response to the shift from a high condition to a low condition of said complementary clock signal to isolate said pull-up transistor from said low power supply and said enabling signal whereby the voltage level at said output terminal is increased due to the charge stored in the intrinsic capacitance in the pull-up transistor.

6. A clock buffer circuit as defined in claim 5 further including means for receiving the advance enabling signal from the module generating the complementary clock signal as a complementary advance enabling signal, said complementary advance enabling signal receiving means conditioning said switch means to couple said enabling signal to said pull-up transistor to de-energize said pull-up transistor when said enabling signal is thereafter shifted to a low condition.

7. A clock buffer circuit as defined in claim 6 further including means for receiving a further pair of complementary clock signals as second and third enabling signals such that the second enabling signal is high when the clock signal is to shift from a low state to a high state and the third enabling signal is high when said clock signal is to shift from a high state to a low state, said input means including enabling signal switch means connected to said second and third enabling signal receiving means conditioned to couple said enabling signal to said pull-down transistor means when said second enabling signal is high and to not couple said enabling signal to said pull-down transistor means when said third enabling signal is high.

8. A clock buffer circuit as defined in claim 7 in which said input means comprises transistor means having input signal means connected to said input means, output signal means connected to control said pull-down transistor means and said switch means, and control means comprising pull-up transistor means and pull-down transistor means connected in series between drain and source power supplies, the node between said pull-up and pull-down transistors being connected to control said transistor means, said pull-up transistor means being connected to receive said second enabling signal and said pull-down transistor means being connected to receive said third enabling signal.

* * * * *